(12) United States Patent
Sargent, IV et al.

(10) Patent No.: US 6,404,949 B1
(45) Date of Patent: Jun. 11, 2002

(54) OPTICAL FIBER INTERFACE FOR INTEGRATED CIRCUIT TEST SYSTEM

(75) Inventors: Thornton W. Sargent, IV, Redwood City; Douglas W. Smith, Portola Valley, both of CA (US)

(73) Assignee: inTEST IP Corporation, Wilmington, DE (US)

( * ) Notice: Subject to any disclaimer, the term of this patent is extended or adjusted under 35 U.S.C. 154(b) by 0 days.

(21) Appl. No.: 09/841,688

(22) Filed: Apr. 23, 2001

Related U.S. Application Data

(63) Continuation of application No. 08/847,305, filed on Apr. 23, 1997, now Pat. No. 6,249,621, which is a continuation of application No. 08/436,656, filed on May 8, 1995, now abandoned.

(51) Int. Cl.[7] .............................. G02B 6/28; G02B 6/43
(52) U.S. Cl. ............................ 385/24; 385/89; 250/551
(58) Field of Search .............................. 385/24, 15, 27, 385/88, 89, 100, 101; 359/173, 188, 195, 161, 153; 324/753, 754, 72.5, 96; 250/551

(56) References Cited

U.S. PATENT DOCUMENTS

| | | | | |
|---|---|---|---|---|
| 4,032,843 A | * | 6/1977 | Loucks | ........................ 324/96 |
| 4,420,841 A | * | 12/1983 | Dudash | ...................... 359/113 |
| 4,443,890 A | * | 4/1984 | Eumurian | .................... 359/161 |
| 4,595,839 A | * | 6/1986 | Braun et al. | ................. 250/551 |
| 5,463,311 A | * | 10/1995 | Toy | .............................. 324/96 |
| 6,157,200 A | * | 12/2000 | Okayasu | ..................... 714/724 |
| 6,189,120 B1 | * | 2/2001 | Akram | ........................ 714/724 |
| 6,249,621 B1 | * | 6/2001 | Sargent et al. | ................. 385/24 |

* cited by examiner

*Primary Examiner*—Rodney Bovernick
*Assistant Examiner*—Michael J. Stahl
(74) *Attorney, Agent, or Firm*—Ratner & Prestia

(57) ABSTRACT

A bi-directional interface for transmitting signals between a circuit tester and a connection point proximate to a circuit to be tested includes a first and a second optical fiber link, a first directional gate for coupling both the input end of the first link and the output end of the second link to one endpoint of the interface and a second directional gate for coupling both the input end of the second link and the output end of the first link to the other endpoint of the interface. An optical fiber link for transmitting a signal between a circuit tester and a connection point proximate to a circuit to be tested includes an optical fiber for transmitting the signal, a light source electrically coupled to the link input and optically coupled to the input of the fiber, and a photodetector optically coupled to the fiber output and electrically coupled to the link output.

1 Claim, 5 Drawing Sheets

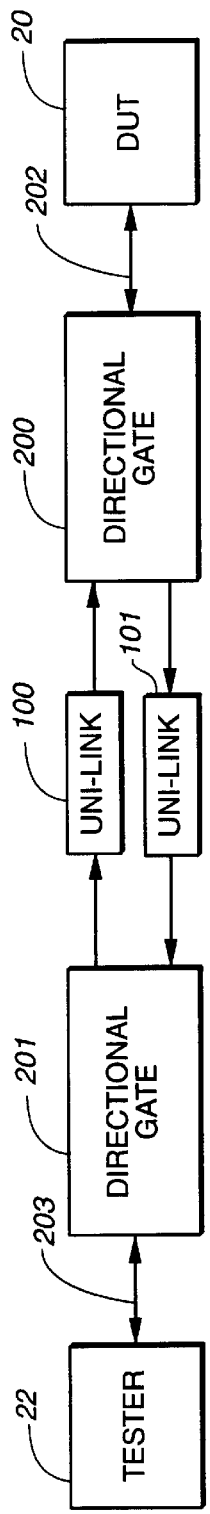
FIG._1A
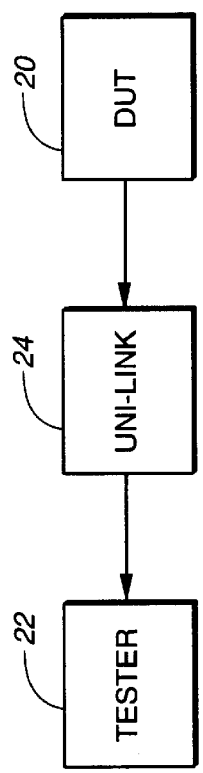
FIG._1B
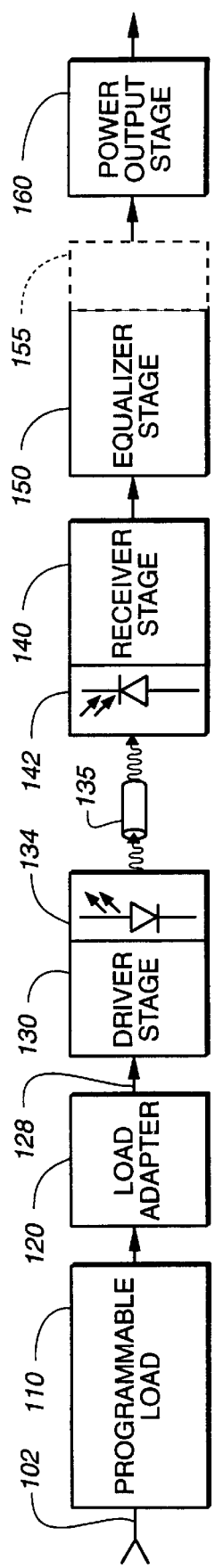
FIG._2

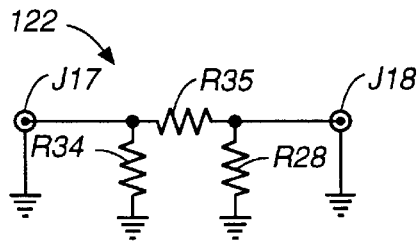
FIG._3A
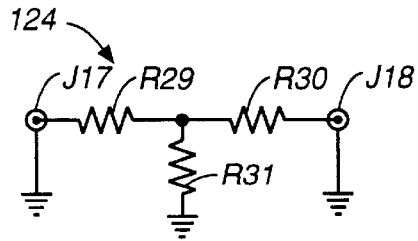
FIG._3B
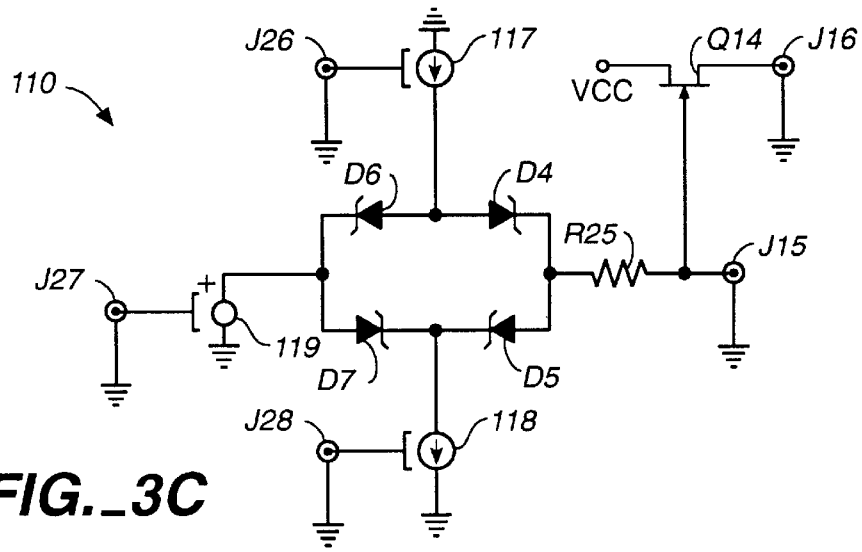
FIG._3C
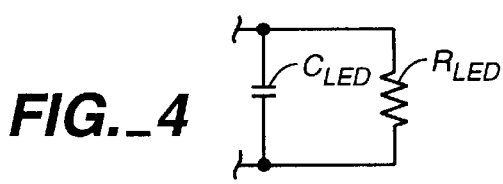
FIG._4
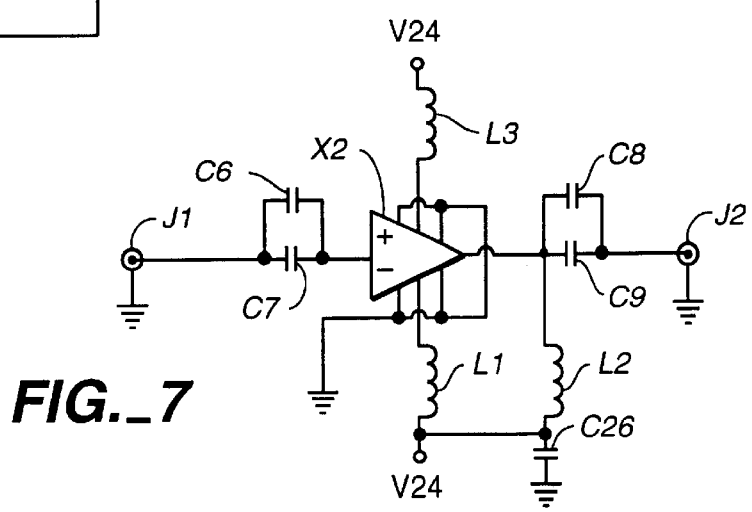
FIG._7

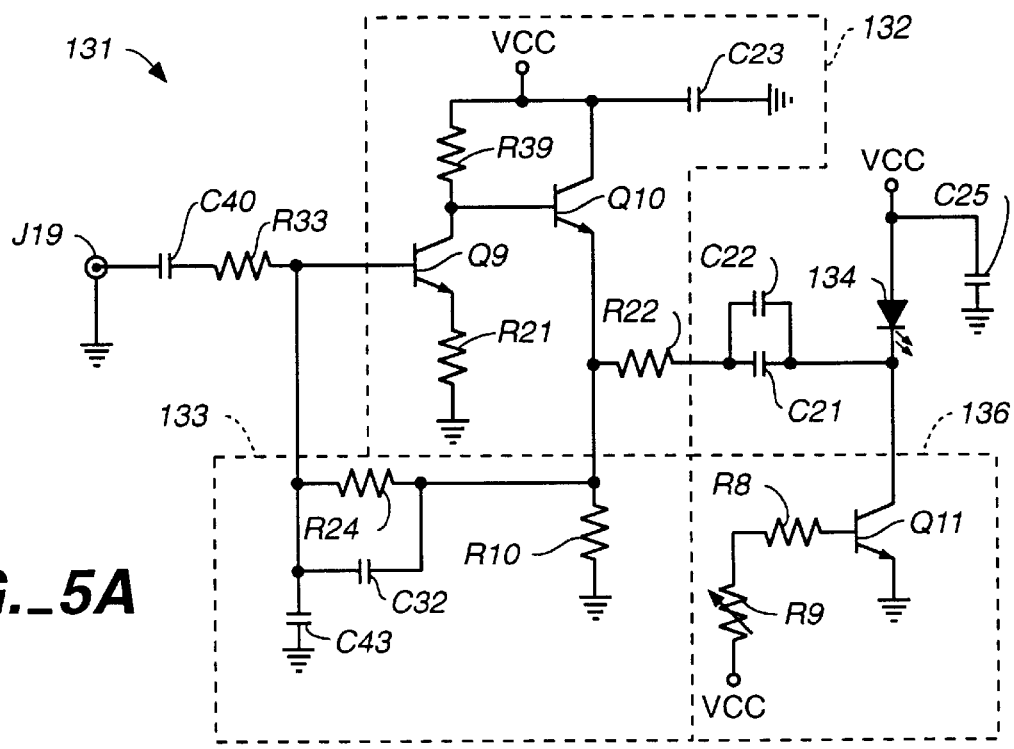
FIG._5A
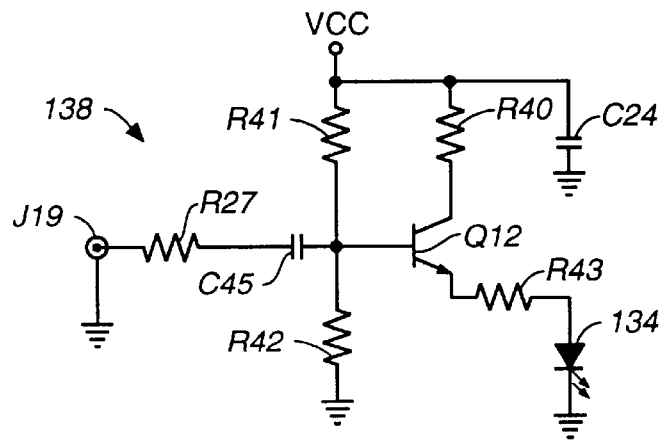
FIG._5B
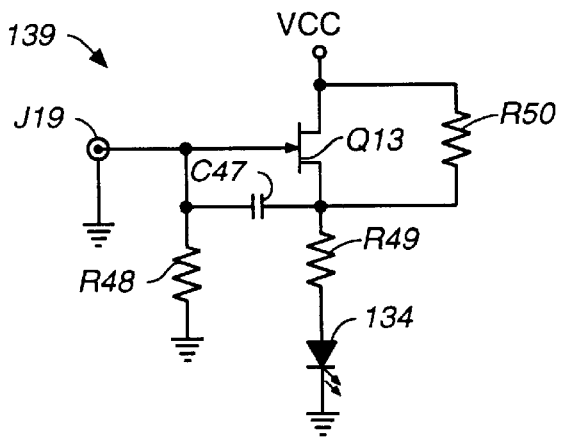
FIG._5C

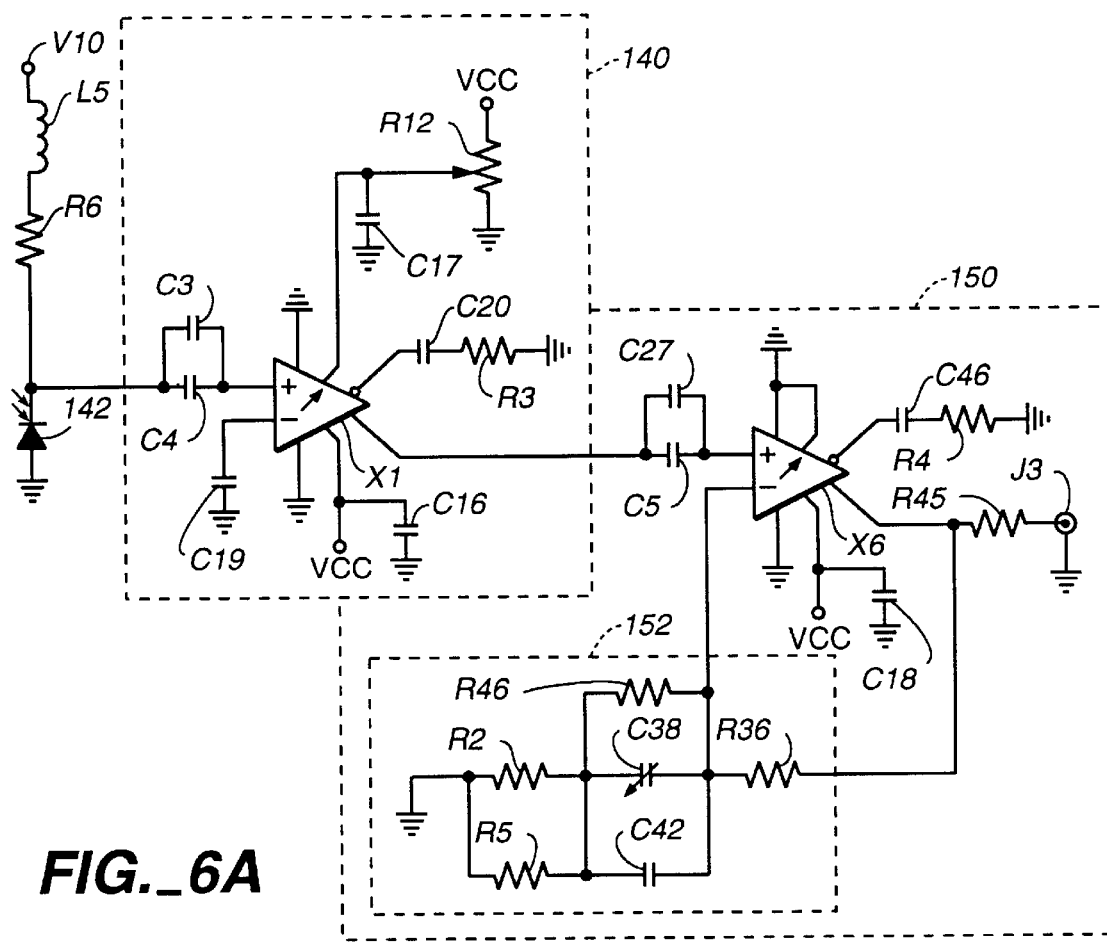
FIG._6A
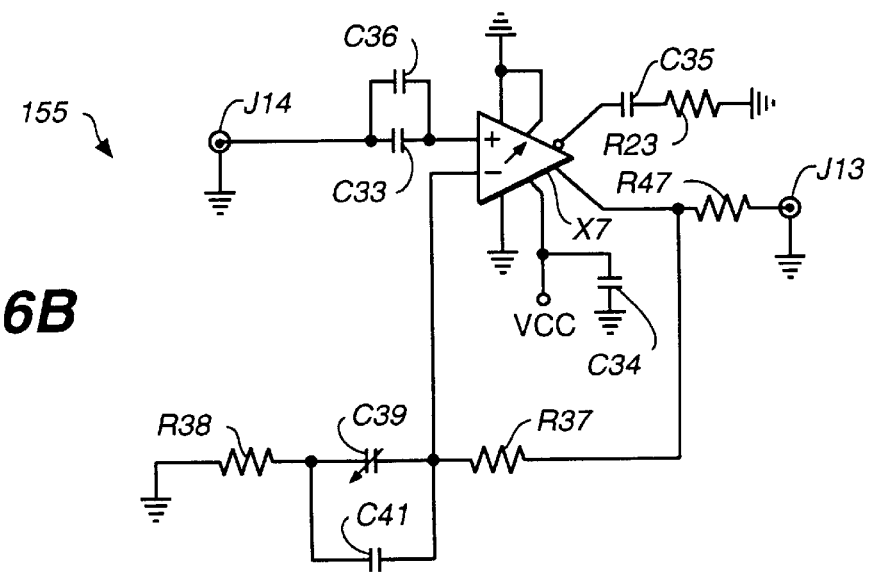
FIG._6B

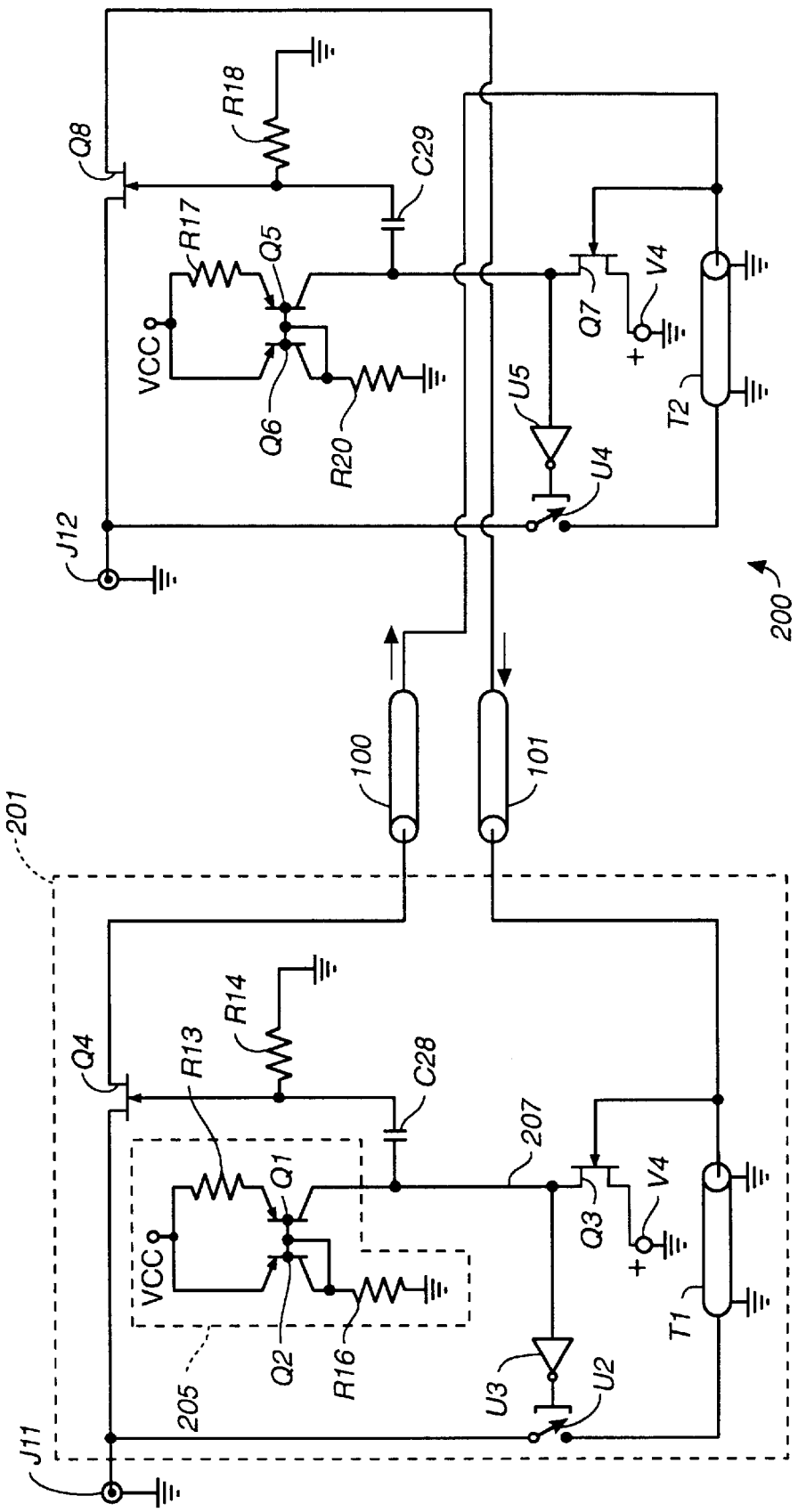
FIG._8

OPTICAL FIBER INTERFACE FOR INTEGRATED CIRCUIT TEST SYSTEM

This application is a continuation of U.S. application Ser. No. 08/847,305, filed Apr. 23, 1997, now U.S. Pat. No. 6,249,621, which is a file wrapper continuation of Ser. No. 08/436,656, filed May 8, 1995, now abandoned.

BACKGROUND OF THE INVENTION

This invention relates generally to systems for testing integrated circuits, and more particularly to the interface between an integrated circuit wafer or chip and a load board.

Conventionally, an integrated circuit test system is connected to the device under test ("DUT") through a load board, which is connected by coaxial cables to a probe card, which is connected to the DUT itself. The probe card is conventionally a printed circuit board with connections for the coaxial cables, fine needles for making contact with the connection points on the DUT, and printed traces on the printed circuit board connecting each cable to a needle.

The quality of test measurements is affected by the nature of the electrical connections, or interface, between the DUT and the test system. It has long been known that long coaxial cables impair the testing of signals, but there has been little success in correcting the problem, despite numerous efforts directed to solving the problem. The bandwidth of coaxial cable is limited. This bandwidth limitation is caused by a high-frequency physical effect called the "internal impedance" of the cable. This effect can cause signal distortion in the cable. Cable-induced signal distortions include mismatch errors between the probe card and cable and between the load board and cable. Cable-induced effects also include power loss and impedance mismatch errors within the cables, dispersion of the transmitted signal, crosstalk, ground loops, and phase distortion.

Nevertheless, flexible and long cables are desired to facilitate movement of the probe card, and to separate spatially the probe card from the load board and the typically large test system. Because the number of channels of an integrated circuit to be tested can number in the hundreds, the bundle of cables can become unwieldy, reducing flexibility and access to the DUT.

SUMMARY OF THE INVENTION

In general, in one aspect, the present invention provides a link based on optical fibers to carry a signal between a test system and a connection point proximate to an integrated circuit device to be tested. The link includes an optical fiber for transmitting the signal, a light source electrically coupled to the link input and optically coupled to the fiber input, and a photodetector optically coupled to the output of the fiber to receive light and electrically coupled to the link output. In other aspects, the invention includes a receiver stage to receive the output of the photodetector, an equalizer stage to receive the output of the receiver stage, a high-pass filter stage to receive the output of the equalizer stage, and a power output stage to receive the output of the equalizer stage or, alternatively, of the high-pass filter stage.

In general, in another aspect, the receiver stage includes a microwave differential amplifier to receive the output of the photodetctor, and the equalizer stage includes a differential amplifier in differential mode with a negative feedback function, that receives the output of the receiver stage and provides a first-order high-pass closed-loop response.

In general, in another aspect, the light source includes a light emitter and a driver stage, a load adapter to receive the signal and to transmit the signal to the driver stage. In another aspect, the invention includes a programmable load configured to receive the signal and to transmit the signal to a load adapter or driver stage. In another aspect, the light emitter is a light emitting diode/or a laser diode and the driver stage produces a DC bias current of about 60 mA coupled to a modulation current derived from the signal of about 30 mA. In another aspect, the driver stage includes an emitter-follower driver. In another aspect, the driver stage includes an FET (field-effect transistor) source-follower driver.

In general, in another aspect, the photodetector is a photodiode biased in photoconductive mode, and the optical fiber is a multimode 100/140 micron tapered-index fiber of less than about five meters in length.

In general, in another aspect, the invention provides bi-directional interface for transmitting signals between a circuit tester and a connection point proximate to a circuit to be tested and includes a first optical fiber link to provide for transmission in one direction and a second optical fiber link to provide for transmission in the other direction, a first directional gate for coupling both the input end of the first link and the output end of the second link to one endpoint of the interface, and a second directional gate for coupling both the input end of the second link and the output end of the first link to the other endpoint of the interface.

In general, in another aspect, the first directional gate includes a normally-closed switch between the input of the first link and the one endpoint of the interface, a normally-open switch between the output of the second link and the one endpoint, a sense switch coupled to the second link and connected, on sensing a signal from the second link, to cause the normally-open switch to close and the normally-closed switch to open, and a delay line between the output of the second link and the normally-open switch, in parallel with the sense switch, and connecting the output of the second link to the one endpoint when the normally-open switch is closed.

Among the advantages of the invention are the following. The invention provides an electrical connection which overcomes the problems of resistive power loss and cross-talk in coaxial cables by substituting a fiber-optic interface system, which provides a bandwidth extending to at least 400 MHz with impedance matching at both ends of this interface, even where the impedances are different at the two ends of the interface. Moreover, the invention eliminates mismatch errors in the interface, reduces the diameter of the cables and cable bundle by a factor of about 2 or 3, provides increased flexibility of cable, and provides cables of any length less than about 100 meters without significant signal dispersion. The invention also provides optical isolation of the signals from each other, from ground, and between the probe card and load board. In particular, source and load are isolated (buffered) from each other, so that mismatch errors between them are reduced, and excellent impedance match to source and load is achieved.

The use of long, light and flexible fiber-optic cables makes it possible to extend the probe card away from the load board, to manipulate the position and angle of the probe card with moderate force, and to make the probe card more accessible.

Other advantages and features will become apparent from the following description and from the claims.

BRIEF DESCRIPTION OF DRAWINGS

The accompanying drawings, which are incorporated in, and constitute a part of, the specification, schematically illustrate specific embodiments of the invention and, together with the general description given above and the detailed description of the embodiments given below, serve to explain the principles of the invention.

FIG. 1A is a block diagram of a bi-directional optical fiber interface.

FIG. 1B is a block diagram of a uni-directional optical fiber interface.

FIG. 2 is a block diagram of a uni-directional optical fiber link.

FIG. 3A is a circuit diagram of a TTL load adapter for use with a 3-transistor driver in the optical fiber link of FIG. 2.

FIG. 3B is a circuit diagram of a TTL load adapter for use with an emitter-follower driver in the optical fiber link of FIG. 2.

FIG. 3C is a circuit diagram of a programmable load for use in the optical fiber link of FIG. 2.

FIG. 4 is a circuit diagram of a model of an LED.

FIG. 5A is a circuit diagram of a 3-transistor driver for use in the optical fiber link of FIG. 2.

FIG. 5B is a circuit diagram of an emitter-follower driver for use in the optical fiber link of FIG. 2.

FIG. 5C is a circuit diagram of an FET source-follower driver for use in the optical fiber link of FIG. 2.

FIG. 6A is a circuit diagram of the receiver side of the optical fiber link of FIG. 2.

FIG. 6B is a circuit diagram of an optional supplemental high-pass filter stage for the receiver side of the optical fiber link of FIG. 2.

FIG. 7 is a circuit diagram of a power output stage for use in the optical fiber link of FIG. 2.

FIG. 8 is a circuit diagram of directional gates for use in a bi-directional optical fiber interface.

DETAILED DESCRIPTION

Turning to FIG. 1A, a bi-directional optical fiber interface useful for carrying signals between a DUT 20 and a tester 22 of conventional design includes a pair of uni-directional optical fiber links ("uni-links") 100 and 101, each of which is coupled to a pair of directional gates 200 and 201, as shown. At the DUT end, directional gate 200 is coupled to a pin, pad, or other connection point of the DUT, conventionally through a probe card (not shown). In operation, signals generated by the tester at signal path 203 are switched by directional gate 201 to travel through uni-link 100 and then through directional gate 200 to appear at signal path 202. Directional gate 200 switches signals so that signals incoming from uni-link 100 are not sent back into uni-link 101. Similarly, directional gate 201 switches signals so that signals incoming from uni-link 101 are not sent back into uni-link 100. Turning to FIG. 1B, if the channel requires only propagation in one (either) direction, the directional gates may be omitted and only one uni-link 24 is required.

It is contemplated that a bi-directional optical fiber interface would be used in place of the conventional coaxial cables to carry signals between a DUT (conventionally connected to a probe card for testing) and an integrated circuit tester (conventionally connecting at a load board), all of which are well known in the art. Each uni-link has a fiber-optic line (an optical fiber), as shown in FIG. 2. Fiber-optic lines are often bundled into cables. Fiber-optic cable bundles are substantially lighter than corresponding coaxial cable bundles, and are much easier to manipulate.

Turning to FIG. 2, the first stage of a uni-link 24, 100 or 101 is optionally a load adapter 120 or a programmable load 110, which are described in more detail below in connection with FIGS. 3A through 3C. The signal next passes into the drive stage 130, which includes a light emitter 134 that converts an electrical signal into a light signal that is focused into one end of a fiber-optic line (optical fiber) 135. The other end of optical fiber 135 is coupled to a photodetector 142, which converts the received light power into current that is fed to a first receiver stage 140. (If amplification is provided by later stages, or if low signal levels are acceptable, receiver stage 140 may be omitted.) Receiver stage 140 is coupled to a second receiver stage, namely an equalizer stage 150 (also called the post-emphasis stage), which is coupled to the last receiver stage, namely a power output stage 160. Optionally, a high-pass filter stage 155 follows the equalizer stage 150. The equalizer stage 150 and the high-pass filter stage 155 extend the bandwidth of the signal path, as will be described. The power output stage 160 provides larger signal levels, if required, than are provided by the preceding stage.

For the design parameters of the described embodiment, it is desirable to achieve a low-cost fiber-optic link with a rise time of less than 1 nanosecond ("ns"). Light sources that may be selected as light emitter 134 are available in two broad classes: lasers and light emitting diodes ("LEDs"). Within each class, a broad range of wavelengths, speeds and powers are available. While any lasers are inherently faster than 1 ns, a less expensive solution is desired. Thus, LEDs, and in particular, two types of LEDs, are of interest: infrared and visible light LEDs. Visible light has the advantage that it can be seen, which can prove useful in manufacturing and in the field. Infrared LEDs tend to be slightly faster and slightly more expensive. The selected light emitter 134 is a visible-light LED available from the Hewlett-Packard Company of Palo Alto, Calif., the HP HFBR-14×4. This is a GaAlAs 820 nanometer ("nm") emitter with a rise time of 3 to 4 ns.

The HP HFBR-14×4, like some other LEDs, is slower than the test system demands, but is selected for cost considerations. Its speed limitation is due to its intrinsic capacitance. To extend the bandwidth of the LED without distortion of the signal, an emphasis circuit is provided, as will be described.

The HP HFBR-14×4 exhibits non-ideal temporal behavior when it is modulated fully, i.e., when it is not DC-biased and the modulation index approaches unity. In this case it exhibits a "tail": the turnoff time is greater than the turn-on time. However, when the LED is operated with a DC bias and smaller modulation index levels, its rise and fall times are more symmetrical. The best DC bias level, as suggested by the manufacturer, is determined by a "knee" in the power transfer function. (See p. 5–27 of 93/94 HP Optoelectronics Designer's Catalog, Hewlett-Packard part no. 5091-4573E, 1992.) This DC current bias level is about 60 milliamps ("mA"), and the LED behavior is nearly ideal (conforming to the RC model) when the LED is operated above this "knee".

In alternative embodiments, laser sources, which provide faster response at higher cost, are used to achieve higher performance. Where laser performance is insufficient without enhancement, speed-enhancement of laser devices may be accomplished using the same techniques described below, with the difference that the transfer function of laser devices is second-order rather than first-order.

The selected photodetector 142 is the UDT PIN-HS008, a high-speed device from UDT Sensors, Inc., of Hawthorne, Calif. ("UDT"). The UDT PIN-HS008 has a 0.35 ns rise time. Detectors like this are most optimally used for the present application when biased to photoconductive operation. (Reference is made to pages 3 to 9 of UDT's optoelectronic Components Catalog, which is incorporated herein by this reference, for a description of detector theory and biasing.)

The fundamental purpose of driver stage 130 is to isolate the electrical signal source at input 128 from LED 134. The signal source normally would have sufficient power to drive the LED to the necessary light output levels, so little gain is needed in the driver stage. Instead, the driver stage 130 is designed to provide impedance matching, DC bias, isolation, and overload protection.

All standard digital logic forms of interest—such as transistor-transistor logic (TTL), complementary metal-oxide semiconductor logic (CMOS), N-channel metal-oxide semiconductor logic (NMOS), emitter-coupled logic (ECL), and integrated injection logic ($I^2L$)—use positive binary logic in which only two states, "low" and "high", or "0" and "1", are used; and logic state "1" is always a higher voltage than logic state "0". Although these logic types use different voltage levels and have different input and output impedances, they can all be accommodated by the methods herein described. Driver stage 130 has been designed to be fitted with an appropriate load adapter 120 to adapt the impedance and signal level of any logic type (except ECL, which is described below) to the driver stage 130 input. To conserve power, the primary power supply level ($V_{cc}$) is a low 5 volts ("V"). Logic types that use voltage levels higher than this are accommodated by the power output stage 160, which is capable of producing large signal levels with a higher supply voltage V24. For ECL logic, a negative supply voltage is used; because the design is virtually identical in form to the circuits illustrated herein, it is not separately illustrated. The illustrated embodiment has been designed for compatibility with TTL logic, which has a minimum value of load impedance of approximately 25 ohms and a maximum signal level of 3.7 volts.

The various logic types can be mated to driver stage 130 by inserting an appropriate load adapter 120 or programmable load 110 or both between the uni-link input 102 and driver stage 130, as shown in FIG. 2. The input to the uni-link can arrive from either the DUT or the tester either directly (for a uni-directional interface as shown in FIG. 1B) or through direction gate 200 or 201 (for a bi-directional interface as shown in FIG. 1A). Several alternative embodiments of driver stage 130 and of load adapter 120 will be described. In each case, the load adapter input and output are designated J17 and J18, respectively (see FIG. 3A–3B); and the driver stage input and output are designated J19 and 134, respectively (see FIG. 5A–5C). The connection 128 (FIG. 2) is the connection between J18 and J19.

Turning to FIG. 3A and FIG. 3B, two examples of load adapters are given: the "pi" load adapter 122 (FIG. 3A) is designed for use with the driver embodiment of FIG. 5A, and the "tee" load adapter 124 (FIG. 3B) is designed for use with the driver embodiments of FIG. 5B or FIG. 5C. These load adapters are also useful for adapting the driver embodiments of FIGS. 5A, 5B, or 5C to the programmable load of FIG. 3C as described below.

Turning to FIG. 3C, logic forms are so numerous and conform to so many different load currents and voltages that one way to provide the right load conditions is by terminating the DUT at connection J15 with a programmable load such as is shown in FIG. 3C. The programmable load provides electronically controlled DC current sources and sinks, and a voltage source to satisfy the DC pull-up and hold-down current requirements and termination voltages of logic gates. The load currents at current sources 117 and 118 and commutation voltage at voltage source 119 are set remotely by use of control line inputs J26, J28 and J27, respectively, which may be set in various ways, including under program control by tester 22. For all DUT nodes (channels) which are of the same logic type (as usually all are the same type), the inputs J26, J27 and J28 of each channel may be connected in parallel, so that only three (J26, J27 and J28) external DC lines are needed to set the load conditions for the system. The illustrated programmable load design is derived from the diode bridge load described in *Understanding the Polaris Diode Bridge Loan,* Polaris Application Note 401 (no date), Megatest Corporation, San Jose, Calif. which publication is incorporated herein by reference. The programmable load herein described differs from this reference in that there are no "drive off" switches used to tri-state the load, as this function is obviated by use of the directional gates 200 and 201. In the case of a uni-link, there is no need to tri-state the bridge load because the drive state is constant (the signal travels in only one direction).

The high input impedance of FET source-follower stage Q14 samples the DUT voltage at node J15 without loading node J15. From node J16, the output signal is connected to a pi or tee load adapter 120 at node J17 and subsequently from node J18 to driver stage 130. In the case of driver stage 130 being the embodiment shown in FIG. 5C, the resistor values of the tee load adapter 124 (FIG. 3B) may be reduced to those of a simple voltage divider (in order to adjust the signal level) and resistor R48 of FIG. 5C may be omitted.

Turning to pi load adapter 122 shown in FIG. 3A, the input impedance at J17 is 25 ohms to conform to the TTL load condition, and the output impedance at J18 is matched to the driver input impedance of 25 ohms at connector J19 of driver 131 of FIG. 5A. This load adapter has an attenuation value of 15 dB to reduce the TTL output level of 3.5 V to 0.5 V at the driver input (J19, FIG. 5A).

The tee load adapter 124 of FIG. 3B also has a TTL input impedance (at J15) of 25 ohms, but its output impedance (at J18) is matched to the alternative driver input impedance at connector J19 of driver 138 of FIG. 5B or driver 139 of FIG. 5C and the attenuation of tee load adapter 124 is 10 dB. When the source to the link is the tester rather than the DUT, a load adapter whose input impedance is matched to the tester source impedance (usually 50 ohms) is used.

Turning to FIG. 5A, a signal to be transmitted enters 3-transistor driver 131 at J19 where resistor R33 provides a 25 ohm match to the base of transistor Q9. Isolation amplifier 132 inverts the signal and provides shunt-shunt feedback through the negative feedback loop 133 to convert an input signal level of 0.5 V into an LED modulation current of about 30 mA. This current is then AC-coupled through capacitors C21 and C22 where it combines with the 60 mA bias current in LED 134. The DC bias current source 136 of transistor Q11 provides a constant current of 60 mA to LED 134. Alternatively, a more sophisticated current source may be used, such as a Widlar or thermally-compensated source.

LED 134 is biased in this way to obtain linear amplitude modulation and a "carrier" level of light amplitude. The I-V or I-P characteristics of the LED are linear, except that there is a "knee" in the transfer curve at about 60 mA bias current, and this point is taken as the reference level for input current and output light power. When a positive (relative to the reference level) AC input signal current is added to this 60 mA bias current, a standard form of amplitude modulation and associated modulation index results. The initial input condition of the interface is a logic low state and therefore the DC bias reference level of the LED corresponds to the low logic level. For ECL signals, even though the signal levels are negative, the LED is still operated above the 60 mA bias current "knee" because the AC modulation of the diode current is still positive.

Two alternative embodiments of the driver stage are illustrated in FIG. 5B and 5C. The emitter-follower driver 138 of FIG. 5B provides good isolation, but the return loss is only about 12 dB. Combined with a 10 dB tee load adapter for TTL (shown in FIG. 3B), however, the return loss is improved to 22 dB, and this makes an acceptable driver. The FET source-follower driver 139 of FIG. 5C has a high-impedance, low-capacitance input at the gate of transistor Q13 and very good isolation. Its input impedance is set by the value of resistor R48 and the DC bias current is set by resistors R49 and R50. The best input signal level for this driver is 2 volts (set by the tee load adapter described above). An advantage of both of these drivers (besides being simpler than the one in FIG. 5A) is that they efficiently combine the LED DC bias with the modulation using one (high-power) transistor. In both of these alternative embodiments, the DC bias current and AC modulation amplitude of the LED are designed to the same values as in the first embodiment described.

When the uni-links of FIG. 1A and/or FIG. 1B are used as signal paths for a multichannel tester, as described above, optical fiber 135 will be one fiber in a cable (not shown) containing about 100 fibers. In the described embodiment, optical fiber 135 is a multimode 100/140 micron tapered-index fiber. (The "100/140" refer to the core and cladding/diameters, respectively.) Any fiber that satisfies the dispersion and power-handling requirements would do; however, multi-mode fibers are easier to work with. The light power that can be coupled into a fiber depends on the geometrical optics of the lens-fiber system and is roughly proportional to the cross-sectional area of the fiber core. The 100/140 size was chosen as providing the greatest light power carrying capacity. However, where greater cable flexibility is desired, the fiber size can be reduced in order to reduce cable diameter. When this is done, the gain of the receiver end of the link is increased to compensate for the lower light power in the fiber.

Key to the ability to enhance the speed of a low-cost source-diode fiber-optic link is the degree of bandwidth extension attainable by emphasis without incurring distortion of the signal. The behavior of an LED closely fits the simple model of an ideal RC low-pass filter, where $R_{LED}$ and $C_{LED}$ are the intrinsic resistance and capacitance, as illustrated in FIG. 4. When coupled with a suitable active first-order high-pass filter, the frequency limitation of the low-pass diode is compensated for by the high-pass filter, and the bandwidth of the system can be extended. Thus, the low-bandwidth diode signal is said to be "emphasized" by the active filter. When emphasis is tuned in such a way as to balance the low-pass filter precisely, restoring the signal to its original form, the signal is said to be "equalized" (in this description, however, the terms will be used interchangeably). Equalization is often used in other applications to compensate for optical dispersion in the fiber. However, this is not pertinent here, because the amount of optical dispersion is negligible.

With the LED modeled as in FIG. 4, the equivalent circuit is that of a resistor-capacitor parallel combination with the high-frequency rolloff occurring as a result of current being shunted away from the resistive (light-emitting) part of the diode model by the capacitive reactance. The Laplace transform technique is used below in a simplified analysis of the circuit in which each element is characterized by its transfer function The LED as modeled in FIG. 4 has transfer function l(s). Consider an active filter whose transfer function is f(s), assumed unknown for the moment. Exact equalization is obtained when $$l(s) \cdot f(s) = 1$$

The transfer function f(s) that will yield ideal compensation can now be determined by solving this equation for f(s):

$$f(s) = 1/l(s)$$

which is seen to be the reciprocal of the LED transfer function. This function can be realized in practice by an active filter, as will be described later. For further information on the subject of active filters, reference is made to texts on active filter design, such as Operational Amplifiers: Theory and Practice, by James K. Roberge, John Wiley & Sons, 1975.

Additional marginal performance can be attained by compensation of the next-highest first-order pole (such as the detector pole) and/or higher order poles. First and higher-order poles in the system can be "emphasized" away by adding stages designed in the manner just described, but with the transfer function adjusted to coincide with the pole to be emphasized.

Turning to FIG. 6A, optical fiber 135 is optically coupled to a high-speed photodetector 142 such as the previously described PIN-HS008, biased in photoconductive mode. The bias conditions are set by adjusting the voltage at DC voltage source V10, which has a nominal value of +10 V. Photodetector 142 converts light power into electrical current, which is fed to the input of microwave differential amplifier X1 of receiver stage 140, for which the HP IVA-05208 Silicon Bipolar MMIC 1.5 GHz Variable Gain amplifier used in single-ended mode has been chosen. (This amplifier is described in Hewlett-Packard Communications Components GaAs & Silicon Products Designer's Catalog, 1/1993, publication no. 5091-4574E.) Although the photodetector capacitance is small, about 1 picofarad ("pF"), its response time is limited by the transit time of photogenerated carriers to about 350 picoseconds ("ps") (typical). The low (50 ohm) input impedance of amplifier X1 prevents the response time from being limited by the RC time constant of the photodetector and its load. The photodetector pole can also be equalized, as explained above and later, in which case the low input impedance requirement can be relaxed. The variable gain of amplifier X1 will be used to scale the output level of the interface to match the input signal level. What is required in receiver stage 140 is an amplifier circuit having a low impedance, to give a low time constant. Receiver stage 140 should also provide sufficient gain to attain the desired signal level in combination with the later stages. Similarly, variable gain to set the output signal level can be implemented in receiver stage 140 or in any of the later stages. An alternative embodiment to receiver stage 140 is a transimpedance amplifier of conventional design. Analogous to the input impedance of receiver stage 140, the transimpedance is kept small, unless equalization of the detector pole is performed in a later stage (as explained below), in which case a larger transimpedance value may be used.

Equalizer stage 150 uses differential amplifier X6 in differential mode with a negative feedback function, which results in a first-order high-pass closed-loop response.

Amplifier X6 need not be a differential one, as long as equalizer stage 150 has the first-order high-pass transfer function described above, which transfer function is implemented in this case by feedback loop 152, an RC network. The capacitance of capacitors C38 and C42 of feedback loop 152, the resistance of the resistors R2, R5, R36, and R46 of feedback loop 152, and/or the gain of variable gain amplifier X6 are tuned to maximize the bandwidth while maintaining optimally flat response within the passband. This has the effect of equalizing the pole that was introduced by the LED 134 and "reconstructing" the output waveform to match the input waveform. As a direct result of the equalization, the bandwidth of the signal increases, for example, from 153 megahertz ("MHz") at the filter input C5 to 460 MHz (the bandwidth varies with tuning) at its output J3.

Turning to FIG. 6B, output J3 of the first filter stage (equalizer stage 150) is optionally connected to input J14 of optional supplemental high-pass filter stage 155, which is of similar design, but whose pole is higher in frequency. Tuned in a manner similar to equalizer stage 150, it has the effect of equalizing the signal still further, for example, at the pole frequency of the detector. The emphasis from this optional second stage increases the bandwidth an additional 88 MHz, to 548 MHz. The 10-to-90% rise time, assuming an ideal pulse input, is 626 ps. Further filter stages could be added, of second order if appropriate.

Turning to FIG. 7, power output stage 160 is a high-power stage of conventional design whose input J1 is connected to output J13 of supplemental high-pass filter stage 155 or, in the absence of that stage, to output J3 of equalizer stage 150. Output J2 of power output stage 160 is the output end of a uni-link 24, 100 or 101. Power output stage 160 is used to provide sufficient power to generate a 3.7 volt TTL signal strength into a 50-ohm load. Briefly, power output stage 160 includes wideband RF linear amplifier X2 biased in accordance with the manufacturer's suggestions. (Reference is made to Motorola RF Device Data Catalog, DL110/Rev 4, 1991.) Either class A, B, or C type of amplification can be used in this stage, as long as the performance criteria (described herein) are maintained. The selected amplifier X2 (Motorola CA2820H) has a bandwidth of about 520 MHz. For applications requiring greater bandwidth in uni-link 24, 100, or 101, an RF amplifier with greater bandwidth should be used in power output stage 160.

Turning to FIG. 8, bi-directional operation is achieved with the use of two uni-links (uni-directional optical fiber links) 100 and 101 combined in opposite directions to create a bi-directional optical fiber interface. Each uni-link transmits any signal which appears at its input to the node at its output. To avoid feedback, the operation of the counter-directional path is disabled, when necessary, by directional gate 200 or 201. The directional gates disable the counter-propagating signal path at its input rather than its output in order to minimize power consumption. Returning to FIG. 1A, consider a left-to-right propagating signal as it travels from directional gate 201 to directional gate 200. Switch Q4 of directional gate 201 is normally closed and switch U2 of directional gate 201 is normally open if no counter-propagating signal (from uni-link 101) is present. The left-to-right signal travels through uni-link 100 to directional gate 200 where it is recognized as a counter-propagating signal when it is sensed by gain element Q7 which triggers voltage-controlled switches Q8 and U4, which correspond to switches Q4 and U2 of directional gate 201. Switch U4 is closed to allow the signal to exit at J12 to the pin, for example, of a DUT. Simultaneously, switch Q8 is triggered open in order to prevent this same signal from propagating in the opposite direction. There is a time delay associated with the sense and switch circuit paths, and so a length of microstrip T2 is included so that switch U4 will be closed before the signal arrives. By symmetry, right-to-left propagating signals experience the same treatment as they travel from directional gate 200 to directional gate 201. Briefly, in directional gate 201, gain element Q3 senses the signal and triggers voltage-controlled switches Q4 and U2 to allow the signal to exit at J11 to a connection, for example, on the tester load board. Recovery time of several nanoseconds should be allowed before attempting to propagate a signal in the opposite direction to allow the directional gates to reset.

Selected as switching devices Q4 and Q8 are high-speed, high-current microwave GaAsFETs with a pinch-off voltage, $V_{pinch}$, of about −1.5 V. This gallium arsenide field-effect transistor ("GaAsFET") device is also well suited for use in the sensor function, as its input (gate) impedance is very high, so its connection to the sensed channel does not load the channel. The control voltage, $V_{sw}$, is input to the gate of the sensing FET Q3. The voltage at which switching is triggered is referred to as the threshold voltage, $V_{th}$. FET Q3 is biased in common-source mode with $V_{gs}$ (gate-source voltage) close to $V_{pinch}$. The drain current at node 207 is the product of the control voltage and the device transconductance. The drain is loaded by active load 205, which when combined with the current-source type output of FET Q3 results in a large voltage swing at node 207, thus creating a high voltage-gain stage from the control voltage to the gate of FET Q4. When $V_{sw}<V_{th}$, FET Q3 is off and node 207 is high. When $V_{sw}>V_{th}$, FET Q3 is on and node 207 is low. FET Q4 is normally on when node 207 is high, and it is pinched off when node 207 goes low, i.e., when $V_{gs}$ of Q4 drops to less than $V_{pinch}$. Active load 205 is a Widlar-type current source designed to supply about 2.5 mA of current. It is based on the PNP RF transistors Q1 and Q2. This current source was chosen because it uses small resistance values and hence has a small time constant, i.e., it is fast. An alternative embodiment to this active load 205 is a resistive load of conventional design (not shown). The threshold level, $V_{th}$, can be adjusted by varying the source bias V4, which in practice could consist of a variable resistive voltage-divider with an emitter-follower buffer. A typical value for $V_{th}$ would be 0.1 volts. The normally-open switch U2 uses the same type of FET switch as Q4 with logic inversion U3 input to its gate. Although the FET is the device of choice for switches Q4, Q8, U2, and U4, other devices, such as bipolar transistors and PIN (positive-intrinsic-negative) diodes, could be used. Similarly, for the sensor function performed by switch Q3 and active load 205, any gain stage or sampling stage that does not introduce a mismatch into the signal path would be sufficient.

In an alternative embodiment to directional gates 200 or 201, the voltage-controlled switches Q4, Q8, U2, and U4 are activated by means of a control line input from the tester or other source. In this case, active load 205, switch Q3, and source bias V4 can be omitted from directional gate 201, for example, and replaced with a control line input at node 207.

The values or identities of the circuit components of the circuits shown in the figures ate set forth in Table 1. These are exemplary values for the circuits illustrated. Other values and circuit components could be used, and would be known to one skilled in the art, without departing from the purpose and scope of the present invention.

TABLE 1

| | |
|---|---|
| C3 | 1.5 μF |
| C4 | 100 pF |
| C5 | 100 pF |
| C6 | 1.5 μF |
| C7 | 100 pF |
| C8 | 1.5 μF |
| C9 | 100 pF |
| C16–C20 | .01 μF |
| C21 | 1.5 μF |
| C22 | 100 pF |
| C23 | .01 μF |
| C24–C29 | 1.5 μF |
| C32 | 2 pF |
| C33 | 100 μF |
| C34–C35 | .01 μF |
| C36 | 1.5 μF |
| C38 | 4 to 20 pF |
| C39 | 2 to 6 pF |
| C40 | 1.5 μF |
| C41 | 4 pF |
| C42 | 10 pF |
| C43 | 50 pF |
| C45 | 1.5 μF |
| C46 | .01 μF |
| C47 | 10 pF |
| D4–D7 | Schottky diode HSMS-2818 (Hewlett-Packard) |
| L1–L3 | 33 μH |
| L5 | 10 mH |
| Q1–Q2 | MRF536 (Motorola) |
| Q3–Q4 | ATF21186 (Hewlett-Packard) |
| Q5–Q6 | MRF536 |
| Q7–Q8 | ATF21186 |
| Q9–Q11 | AT42086 (Hewlett-Packard) |
| Q12 | MRF581 (Motorola) |
| Q13–Q14 | ATF21186 |
| R2 | 10 Ω |
| R3–R4 | 49.9 Ω |
| R5 | 10 Ω |
| R6 | 10 KΩ |
| R8 | 6.19 KΩ |
| R9 | 5 KΩ |
| R10 | 25 Ω |
| R12 | 10 KΩ |
| R13 | 25 Ω |
| R14 | 10 KΩ |
| R16 | 250 Ω |
| R17 | 25 Ω |
| R18 | 10 KΩ |
| R20 | 250 Ω |
| R21 | 5 Ω |
| R22 | 15 Ω |
| R23 | 49.9 Ω |
| R24 | 50 Ω |
| R25 | 34 Ω |
| R27 | 20 Ω |
| R28 | 35 Ω |
| R29 | 7 Ω |
| R30 | 35 Ω |
| R31 | 24 Ω |
| R33 | 17 Ω |
| R34 | 35 Ω |
| R35 | 66 Ω |
| R36 | 200 Ω |
| R37 | 50 Ω |
| R38 | 3 Ω |
| R39 | 15 Ω |
| R40 | 15 Ω |
| R41 | 98 Ω |
| R42 | 154 Ω |
| R43 | 10 Ω |
| R45 | 49.9 Ω |
| R46 | 80 Ω |
| R47 | 49.9 Ω |
| R48 | 49.9 Ω |
| R49 | 25 Ω |

TABLE 1-continued

| | |
|---|---|
| R50 | 35 Ω |
| T1, T2 | Delay line |
| U2, U4 | Voltage-controlled switch |
| U3, U5 | Inverter |
| $V_{CC}$ | 5 VDC |
| V4 | 1.35 VDC |
| V10 | 10 VDC (variable) |
| V24 | 24 VDC |
| X1 | IVA05208 (Hewlett Packard) |
| X2 | CA2820H (Motorola) |
| X6, X7 | IVA05208 |

In conclusion, it is appropriate to mention the importance of using high-frequency design techniques in the circuits used to implement the present invention. Because of the high bandwidths, careful attention must be paid to radio frequency and even microwave considerations such as transmission line, source and load impedance matching, phase shifts due to circuit board trace length (especially in feedback loops), parasitic reactance, connectors, and non-ideal component characteristics. These considerations are addressed in the following references: Foundations for Microstrip Circuit Design, 2nd Ed., by Terry Edwards, 1981, 1992, John Wiley & Sons; and Microwave Devices and Circuits, by Samuel Y. Liao 1980, Prentice-Hall.

The present invention has been described in terms of specific embodiments. The invention, however, is not limited to the embodiments depicted and described. Rather, the scope of the invention is defined by the appended claims.

What is claimed is:

1. A bi-directional interface with a first endpoint and a second endpoint for providing a first path and a second path between the first and second endpoints for transmitting signals between a circuit tester, at the first endpoint, and a connection point proximate to a circuit to be tested, at the second endpoint, the bi-directional interface comprising:

a first link including a first optical fiber to provide a portion of the first path, the first link and the first optical fiber each having an input end and an output end;

a second link including a second optical fiber to provide a portion of the second path, the second link and the second optical fiber each having an input end and an output end;

a first directional gate for coupling both the input end of the first link and the output end of the second link to the first endpoint, and a second directional gate for coupling both the input end of the second link and the output end of the first link to the second endpoint, wherein the first directional gate comprises:

a normally-closed switch disposed between the input end of the first link and the first endpoint;

a normally-open switch disposed between the output end of the second link and the first endpoint;

a sense switch coupled to the output end of the second link and connected, on sensing a signal from the second link, to cause the normally-open switch to close and the normally-closed switch to open;

a delay line disposed between the output end of the second link and the normally-open switch, in parallel with the sense switch, and connecting the output end of the second link to the first endpoint when the normally-open switch is closed;

a light source electrically coupled to the input end of the second link to receive electrical waveform signals from the circuit to be tested that appear at the second endpoint and operating to convert any received electrical waveform signals to light signals, the light source being optically coupled to the input end of the second optical fiber to transmit the light signals into the input end of the second optical fiber, the light source comprising a light emitter having a transfer function l(s);

a photodetector optically coupled to the output end of the second optical fiber to receive light signals from the second optical fiber and electrically coupled to the output end of the second link to provide a reconstituted electrical waveform signal to the circuit tester;

a receiver stage electrically coupled to receive an output of the photodetector; and an equalizer stage electrically coupled to receive an output of the receiver stage, the equalizer stage providing a transfer function 1/l(s).

* * * * *

UNITED STATES PATENT AND TRADEMARK OFFICE
CERTIFICATE OF CORRECTION

PATENT NO. : 6,404,949 B1
DATED : June 11, 2002
INVENTOR(S) : Sargent, IV et al.

It is certified that error appears in the above-identified patent and that said Letters Patent is hereby corrected as shown below:

<u>Title page,</u>
Item [73], Assignee, "inTEST IP Corporation, Wilmington, DE (US)"
should read -- TestDesign Corporation, Sunnyvale, CA (US)" --

Signed and Sealed this

Twenty-fifth Day of March, 2003

JAMES E. ROGAN
*Director of the United States Patent and Trademark Office*